US009466922B2

(12) United States Patent
Kakoi

(10) Patent No.: US 9,466,922 B2
(45) Date of Patent: Oct. 11, 2016

(54) ELECTRIC COMPONENT CONNECTION UNIT AND ELECTRIC CONNECTION BOX

(71) Applicants: FURUKAWA ELECTRIC CO., LTD., Tokyo (JP); FURUKAWA AUTOMOTIVE SYSTEMS INC., Shiga (JP)

(72) Inventor: Ryusuke Kakoi, Shiga (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 2 days.

(21) Appl. No.: 14/502,646

(22) Filed: Sep. 30, 2014

(65) Prior Publication Data

US 2015/0014016 A1    Jan. 15, 2015

Related U.S. Application Data

(63) Continuation of application No. PCT/JP2013/058937, filed on Mar. 27, 2013.

(30) Foreign Application Priority Data

Mar. 30, 2012 (JP) ................................ 2012-081763

(51) Int. Cl.
*H01R 13/629* (2006.01)
*H05K 5/02* (2006.01)
(Continued)

(52) U.S. Cl.
CPC ......... *H01R 13/629* (2013.01); *B60R 16/0238* (2013.01); *H05K 5/0247* (2013.01); *H02G 3/086* (2013.01)

(58) Field of Classification Search
CPC .. H01R 13/629; H01R 13/62; H01R 13/514; H01R 13/518; H01R 13/2425; H01R 9/24; H01R 9/2408; H05K 5/0247; H05K 7/02; B60R 16/0239; B60R 16/0238; H02G 3/16; H02G 3/086; H01H 85/2045; H01H 2085/208; H01H 45/02; H01H 45/04
USPC .................. 174/50, 520, 535, 549, 59, 541; 439/374, 76.2, 701, 712; 220/324; 361/752, 756, 819
See application file for complete search history.

(56) References Cited

U.S. PATENT DOCUMENTS 5,295,858 A    3/1994 Kasai et al.
5,915,978 A *  6/1999 Hayakawa ........... H01R 9/2425
                                                439/620.27

(Continued)

FOREIGN PATENT DOCUMENTS

CN    1723141 A    1/2006
JP    2598036 Y2   11/1993
(Continued)

OTHER PUBLICATIONS

CD-ROM of the specification and drawings annexed to the request of Japanese Utility Model Application No. 23747/1992; Laid-open No. 84118/1993; paragraphs [0017] to [0020]; Fig. 1 and 9; Sumitomo Wiring Systems, Ltd. published on Nov. 12, 1993.
(Continued)

*Primary Examiner* — Dimary Lopez Cruz
(74) *Attorney, Agent, or Firm* — Osha Liang LLP

(57) ABSTRACT

Block positioning means is provided at an insertion permission frame and a component mounting block, the block positioning means being for positioning the component mounting block with respect to an insertion permission section in a crossing direction crossing an insertion direction in which the component mounting block to which an electric component is attachable is inserted into the insertion permission section.

6 Claims, 10 Drawing Sheets

(51) Int. Cl.
  *B60R 16/023*  (2006.01)
  *H02G 3/08*  (2006.01)

(56) References Cited

U.S. PATENT DOCUMENTS

| | | | | |
|---|---|---|---|---|
| 6,570,088 | B1 * | 5/2003 | Depp | B60R 16/0238 174/50 |
| 6,773,271 | B2 * | 8/2004 | Falchetti | H01H 85/2045 439/701 |
| 6,786,740 | B2 * | 9/2004 | Ito | H01R 13/514 439/76.2 |
| 7,601,020 | B2 * | 10/2009 | Yoshida | H01R 13/64 439/374 |
| 7,717,757 | B2 * | 5/2010 | Yamada | B60R 16/0239 439/701 |
| 8,974,235 | B2 * | 3/2015 | Washihira | H02G 3/16 174/535 |
| 2002/0106942 | A1 * | 8/2002 | Sakurai | H01R 13/518 439/701 |
| 2006/0154532 | A1 | 7/2006 | Yamada et al. | |
| 2008/0169126 | A1 * | 7/2008 | Kanamaru | H05K 7/026 174/535 |

FOREIGN PATENT DOCUMENTS

| | | |
|---|---|---|
| JP | H06-165342 A | 6/1994 |
| JP | H09-284921 A | 10/1997 |
| JP | 2003-174710 A | 6/2003 |
| JP | 2005-086865 A | 3/2005 |

OTHER PUBLICATIONS

International Search Report for PCT/JP2013/058937, mailed Jun. 11, 2013 (2 pages).

* cited by examiner

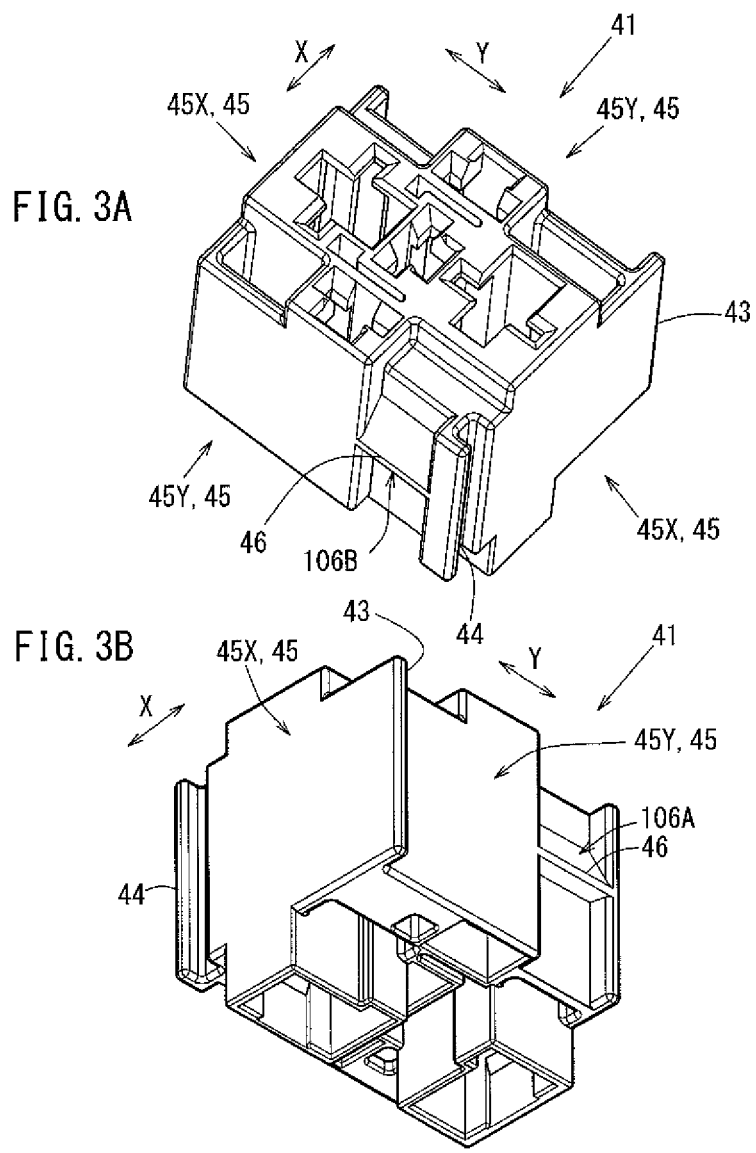

FIG. 4A
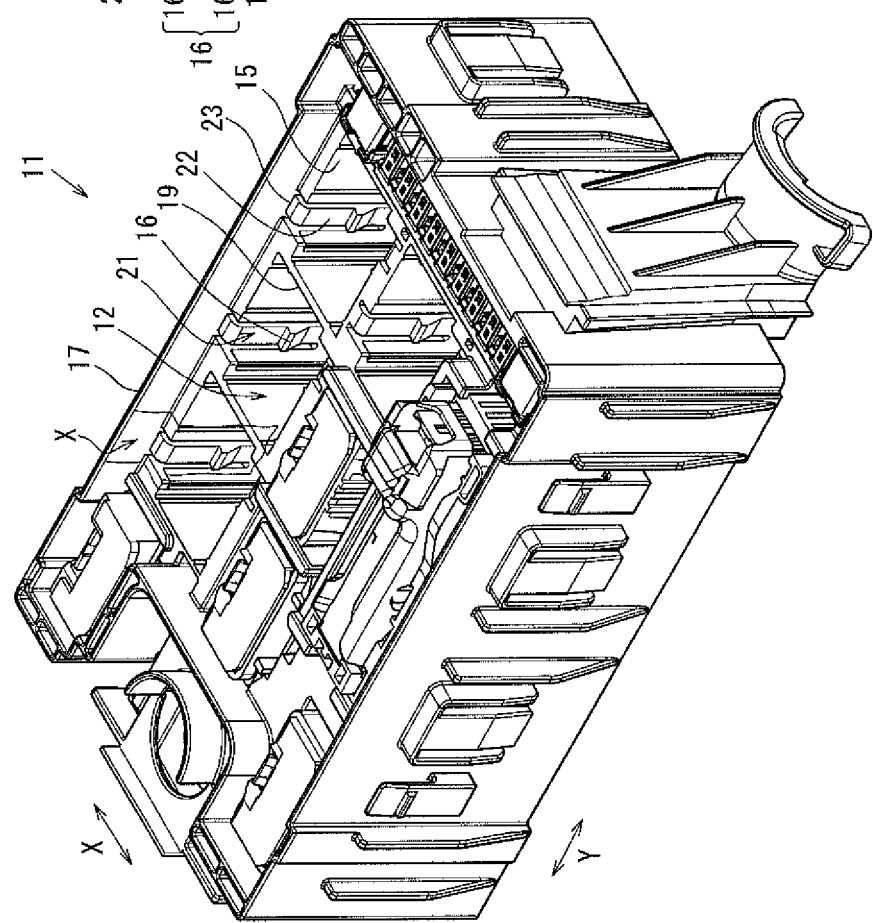
FIG. 4B ENLARGED VIEW OF AREA X
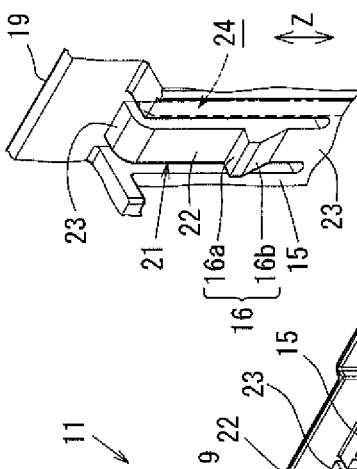

FIG. 6A CROSS-SECTIONAL VIEW TAKEN ALONG LINE A-A
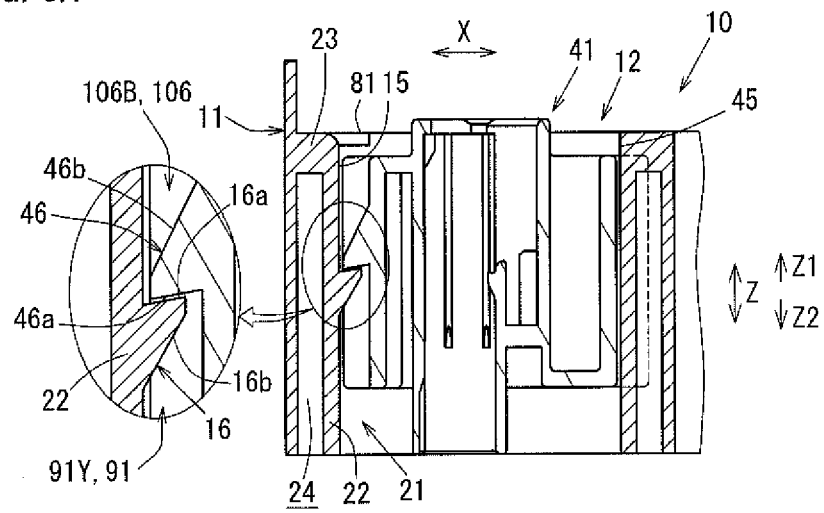
FIG. 6B CROSS-SECTIONAL VIEW TAKEN ALONG LINE B-B
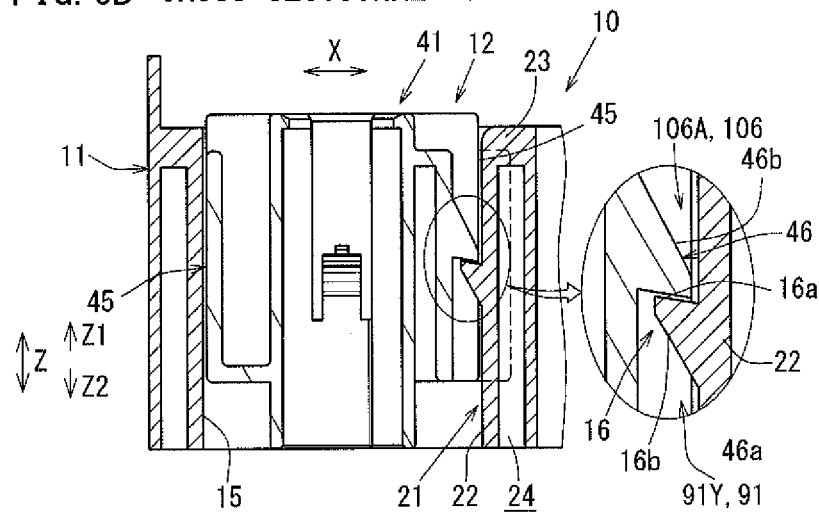

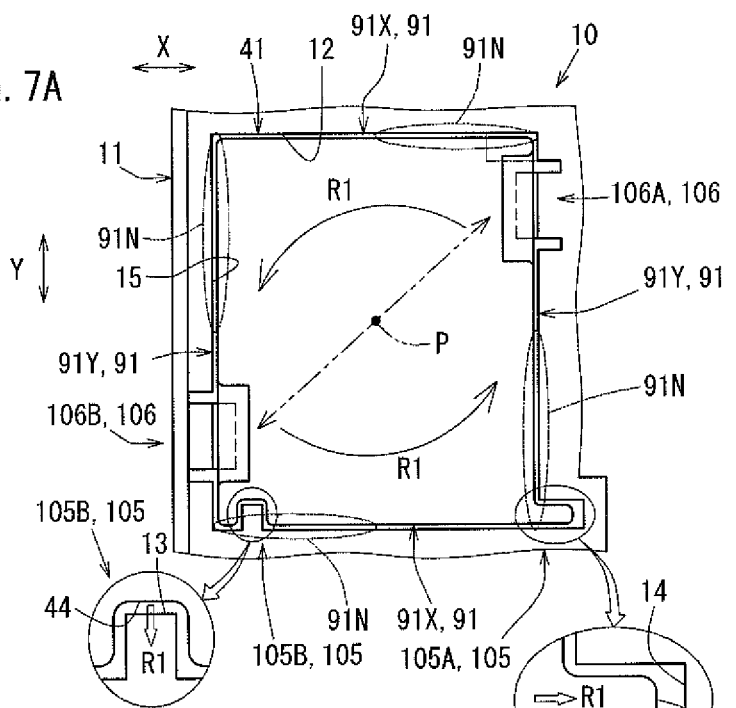
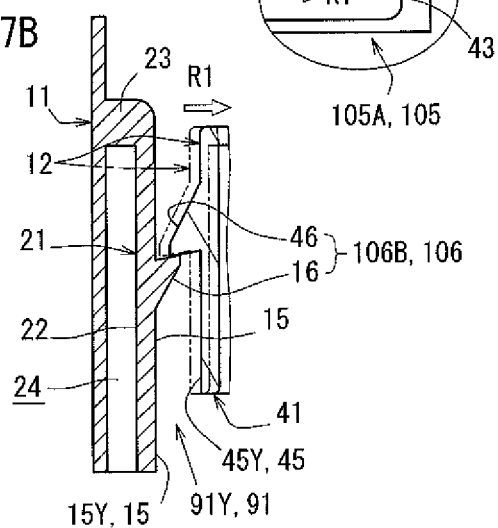

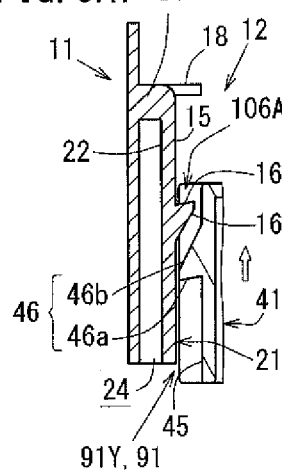
FIG. 9A1
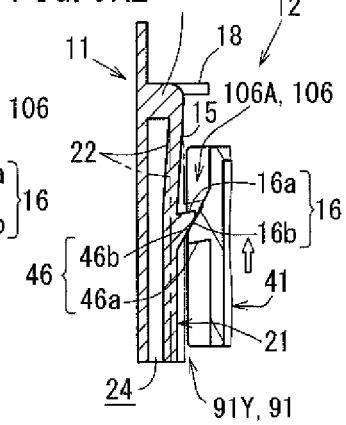
FIG. 9A2
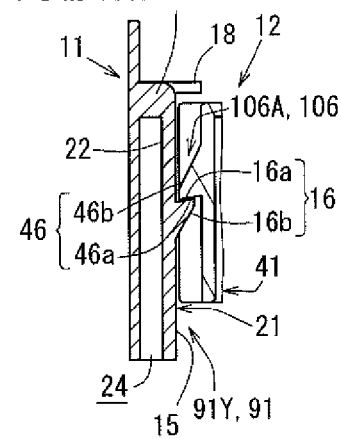
FIG. 9A3
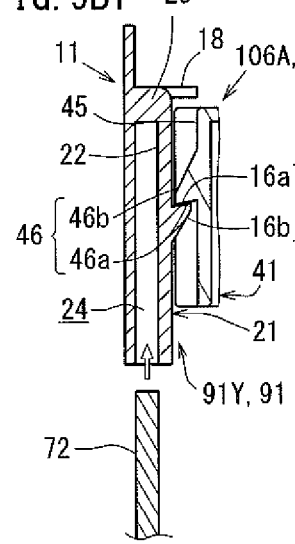
FIG. 9B1
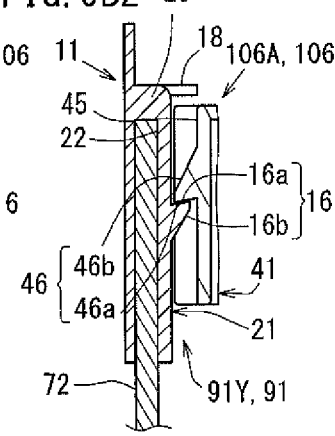
FIG. 9B2

ELECTRIC COMPONENT CONNECTION UNIT AND ELECTRIC CONNECTION BOX

TECHNICAL FIELD

The present invention relates to a vehicle-use electric connection box having an electric component accommodated therein and an electric component connection unit usable in the electric connection box.

BACKGROUND ART

Conventionally, an electric connection box having various electric components such as a relay, a fuse and the like mounted thereon is provided in an automobile. An electric component connection unit accommodated in the electric connection box includes an electric component mounting block having electric components mounted thereon and an insertion permission frame which permits the electric component mounting block to be inserted thereinto and is accommodated in a lower cover of the electric connection box.

As the electric connection box is vibrated by the running of a vehicle, the electric component mounting block inserted into the insertion permission frame is vibrated with respect to the insertion permission frame. As a result, the electric component mounting block is, for example, abraded by the insertion permission frame and thus is disengaged therefrom unexpectedly. Thus, there is an undesirable possibility that a secure electric connection state cannot be provided.

In such a situation, various measures have been taken in order to allow the electric component mounting block to be integrated with the insertion permission frame without becoming unstable with respect thereto even when the electric component mounting block is vibrated.

Patent Document 1 discloses a "cassette relay assembly structure", which is one example of structure for assembling a relay block as the electric component mounting block and a cassette frame as the insertion permission frame. One of the above-described measure is taken for the "cassette relay assembly structure".

The "cassette relay assembly structure" described in Patent Document 1 has the following structure. On an inner wall of the cassette frame, ribs (23, 24) protruding toward the cassette relay block along an insertion direction in which the cassette relay block is inserted into the cassette frame are formed. On an outer wall of the cassette relay block, ribs (11, 12) protruding toward the cassette frame along the insertion direction are formed.

According to the "cassette relay assembly structure" described in Patent Document 1, in a state where the cassette relay block is inserted into the cassette frame, one face of each of the ribs (23, 24) protruding from the cassette frame and one face of each of the ribs (11, 12) protruding from the cassette relay block are put into contact with each other. Owing to this, the cassette relay block can be inserted into the cassette frame without being positionally shifted or inclined.

This will be described in more detail. The rib (11) protruding from each surface of the cassette relay block facing the cassette frame, and the rib (23) protruding from each surface of the cassette frame facing the cassette relay block, are in contact with each other. The rib (12) protruding from each surface of the cassette relay block facing the cassette frame, and the rib (24) from each surface of the cassette frame facing the cassette relay block, are in contact with each other at a position which is away by a prescribed distance from the position where the rib (11) and the rib (23) are in contact with each other.

Owing to this, the cassette relay block is positioned with respect to the cassette frame at a total of two positions between each surface of the cassette relay block and a surface of the cassette frame facing the each surface.

Often times, the ribs formed on the cassette relay block and the cassette frame are not formed at exactly the desired positions but are inevitably formed at positions shifted from the desired positions due to a processing error or the like. Such a positional error regarding the formation of the ribs exerts an adverse influence on the positioning precision of the cassette relay block with respect to the cassette frame.

In the "cassette relay assembly structure" described in Patent Document 1, two or more ribs protruding in a direction perpendicular to a prescribed direction are located at positions which are away from each other by a prescribed distance as described above. Especially such a structure where two ribs are at separate positions causes a disadvantage that the errors of the ribs at the separate positions are accumulated in the prescribed direction. Thus, the adverse influence of the errors regarding the formation of the ribs is exerted more significantly.

As a result, the cassette relay block cannot be firmly positioned with respect to the cassette frame, and thus easily becomes unstable. This causes a problem that the cassette relay block is easily abraded and thus an electrically superb connection state cannot be kept easily.

The influence of the errors regarding the formation of the two ribs at separate positions may cause a problem that the cassette relay block is, for example, stuck when being inserted into the cassette frame and thus cannot be smoothly inserted.

CITATION LIST

Patent Literature

Patent Document 1: Japanese Laid-Open Patent Publication No. 2005-86865

SUMMARY OF INVENTION

Technical Problem

The present invention has an object of providing an electric component connection unit and an electric connection box capable of keeping an electric component mounting block and an insertion permission frame in a superb electric connection state even when the vehicle is vibrated, and also capable of assembling the electric component mounting block to the insertion permission frame smoothly.

Solution to Problem

The present invention is directed to an electric component connection unit including a component mounting block to which an electric component is attachable; and an insertion permission frame having provided therein an insertion permission section for allowing the component mounting block to be inserted thereinto. Block positioning means is provided at the insertion permission frame and the component mounting block, the block positioning means being for positioning the component mounting block with respect to the insertion permission section in a crossing direction crossing an insertion direction in which the component mounting block is inserted into the insertion permission section. The block positioning means includes a positioning protrusion protruding from one of the component mounting block and the insertion permission frame toward the other of the component mounting block and the insertion permission frame; and a positioning recess located at the other of the component mounting block and the insertion permission frame so as to be engageable with the positioning protrusion.

According to the above-described structure, the positioning protrusions protruding from one of the component mounting block and the insertion permission frame toward the other of the component mounting block and the insertion permission frame is put into engagement with the positioning recess, and thus the positioning is realized.

Owing to this positioning structure, the influence of clearances of the positions at which the positioning protrusion and the positioning recess are formed can be suppressed in a direction that is perpendicular to the direction in which the positioning protrusion protrudes. Therefore, the component mounting block can be firmly inserted into the insertion permission frame without becoming unstable.

In an embodiment of the present invention, side-surface facing parts may be provided in each of which an outer side surface of the component mounting block and an inner side surface of the insertion permission frame face each other in the crossing direction. A pair of parallel side-surface facing parts which are generally parallel to each other in the crossing direction may be provided in the side-surface facing parts. Pull-out direction engagement means, for putting the component mounting block into engagement with the insertion permission section in a pull-out direction which is opposite to the insertion direction and in which the component mounting block inserted into the insertion permission section is pulled out from the insertion permission section, may be provided at positions on a diagonal line, the positions being respectively at the pair of parallel side-surface facing parts.

According to the above-described structure, the pull-out direction engagement means, for putting the component mounting block into engagement with the insertion permission section in the pull-out direction which is opposite to the insertion direction and in which the component mounting block inserted into the insertion permission section is pulled out from the insertion permission section, is provided at positions on a diagonal line, the positions being respectively at the pair of parallel side-surface facing parts. Owing to this, as compared with the case where the pull-out direction engagement means is provided at the same number of positions so as to be located to directly face each other, the component mounting block can be engaged with the insertion permission frame at a better balance and thus more stably.

In an embodiment of the present invention, the block positioning means may be formed at the side-surface facing parts in which as the component mounting block rotates with respect to the insertion permission section in a rotation direction in which the engagement of the pull-out direction engagement means located at the positions on the diagonal line is cancelled, the component mounting block approaches the insertion permission section, the pull-out direction engagement means being on a circumference of the component mounting block.

According to the above-described structure, in whichever direction (clockwise direction or counterclockwise direction) the component mounting block may rotate about the insertion direction, resulting in being positionally shifted unexpectedly with respect to the insertion permission section, the firm engagement state is kept by the pull-out direction engagement means located at the positions on a diagonal line.

In an embodiment of the present invention, the pull-out direction engagement means may include a frame-side engageable protrusion protruding from the inner side surface of the insertion permission section toward the component mounting block and a block-side engageable protrusion protruding from the outer side surface of the component mounting block toward the insertion permission section so as to be engageable with the frame-side engageable protrusion. Elastic support means for elastically supporting the frame-side engageable protrusion may be provided at the insertion permission frame. The elastic support means may include an elastically deformable piece deformable toward the side opposite to the block-side engageable protrusion until, as the component mounting block is inserted into the insertion permission section, the block-side engageable protrusion and the frame-side engageable protrusion reach positions at which the protrusions do not overlap each other in a gap between the outer side surface of the component mounting block and the inner side surface of the insertion permission section; and a support section for supporting the elastically deformable piece from both lateral sides thereof with respect to the frame-side engageable protrusion.

According to the above-described structure, the elastically deformable piece is elastically deformable toward the side opposite to the block-side engageable protrusion until the frame-side engageable protrusion and the block-side engageable protrusion reach positions at which the protrusions do not overlap each other. Therefore, when the component mounting block is inserted into the insertion permission section, the frame-side engageable protrusion and the block-side engageable protrusion protruding toward each other do not interfere with each other. Thus, the component mounting block can be smoothly inserted into the insertion permission section without being inhibited.

In this specification, the term "elasticity" refers to a property by which an object which is distorted by application of a stress is recovered to the original shape by the stress being removed. The term "elastic deformation" refers to deformation which is not plastic deformation by which the object is kept distorted even when the stress is removed. The term "elastic support" refers to supporting an object in an elastically deformable state. The term "elastic force" refers to a force by which an object distorted by an applied stress is recovered to the original shape when the stress is removed.

The present invention is also directed to an electric connection box including the above-described electric component connection unit; and a unit accommodation container for accommodating the electric component connection unit. An elastic permission space for allowing the elastic support means to be elastically deformed is provided at the side opposite to the component mounting block with respect to the elastic support means. The unit accommodation container includes elastic restriction means insertable into the elastic permission space so as to restrict the elastic support means from being elastically deformed.

According to the above-described structure, in a state where the electric component connection unit is accommodated in the unit accommodation container, the elastic restriction means provided in the unit accommodation container can be inserted into the elastic permission space. Owing to this, the elastic restriction means inserted into the elastic permission space can restrict the elastic support means from being elastically deformed toward the elastic permission space.

Therefore, the elastically deformable piece is not elastically deformed toward the elastic permission space, for example. Thus, the frame-side engageable protrusion provided on the elastically deformable piece is not moved so as to be distanced away from the block-side engageable protrusion. This prevents the frame-side engageable protrusion and the block-side engageable protrusion from being disengaged from each other unexpectedly. Thus, the superb engagement state between the frame-side engageable protrusion and the block-side engageable protrusion can be kept.

The present invention is directed to an electric component mounting block which is insertable into an insertion permission section provided in an insertion permission frame and on which an electric component is attachable. The electric component mounting block includes a positioning recess engageable with a positioning protrusion protruding from the insertion permission frame so as to be capable of positioning the electric component mounting block with respect to the insertion permission frame in a direction crossing an insertion direction in which the electric component mounting block is inserted into the insertion permission section, or a positioning protrusion protruding so as to be engageable with the positioning recess provided in the insertion permission frame.

The present invention is directed to an insertion permission frame. An insertion permission section for allowing insertion thereinto of a component mounting block on which an electric component is attachable is provided. A frame-side engageable protrusion engageable, in a direction in which the component mounting block is pulled out from the insertion permission section, with a block-side engageable protrusion protruding from an outer side surface of the component mounting block toward an inner side surface of the insertion permission section is provided on the inner side surface of the insertion permission section. Elastic support means for elastically supporting the frame-side engageable protrusion includes an elastically deformable piece deformable toward the side opposite to the block-side engageable protrusion until, as the component mounting block is inserted into the insertion permission section, the block-side engageable protrusion and the frame-side engageable protrusion reach positions at which the protrusions do not overlap each other in a gap between the outer side surface of the component mounting block and the inner side surface of the insertion permission section; and a support section for supporting the elastically deformable piece from both lateral sides thereof with respect to the frame-side engageable protrusion.

Advantageous Effects of Invention

The present invention provides an electric component connection unit and an electric connection box capable of keeping an electric component mounting block and an insertion permission frame in a superb electric connection state even when the vehicle is vibrated, and also capable of assembling the electric component mounting block to the insertion permission frame smoothly.

BRIEF DESCRIPTION OF DRAWINGS

FIGS. 3A and 3B are each an isometric view of a component mounting block.

FIGS. 4A and 4B each show a structure of an insertion permission frame.

FIGS. 6A and 6B are each a vertical cross-sectional view of the insertion permission section and the component mounting block.

FIGS. 7A and 7B each show functions of block positioning means and pull-out direction engagement means.

FIGS. 9A1, 9A2, 9A3, 9B1 and 9B2 each show functions of elastic support means.

DESCRIPTION OF EMBODIMENTS

Figure 1:
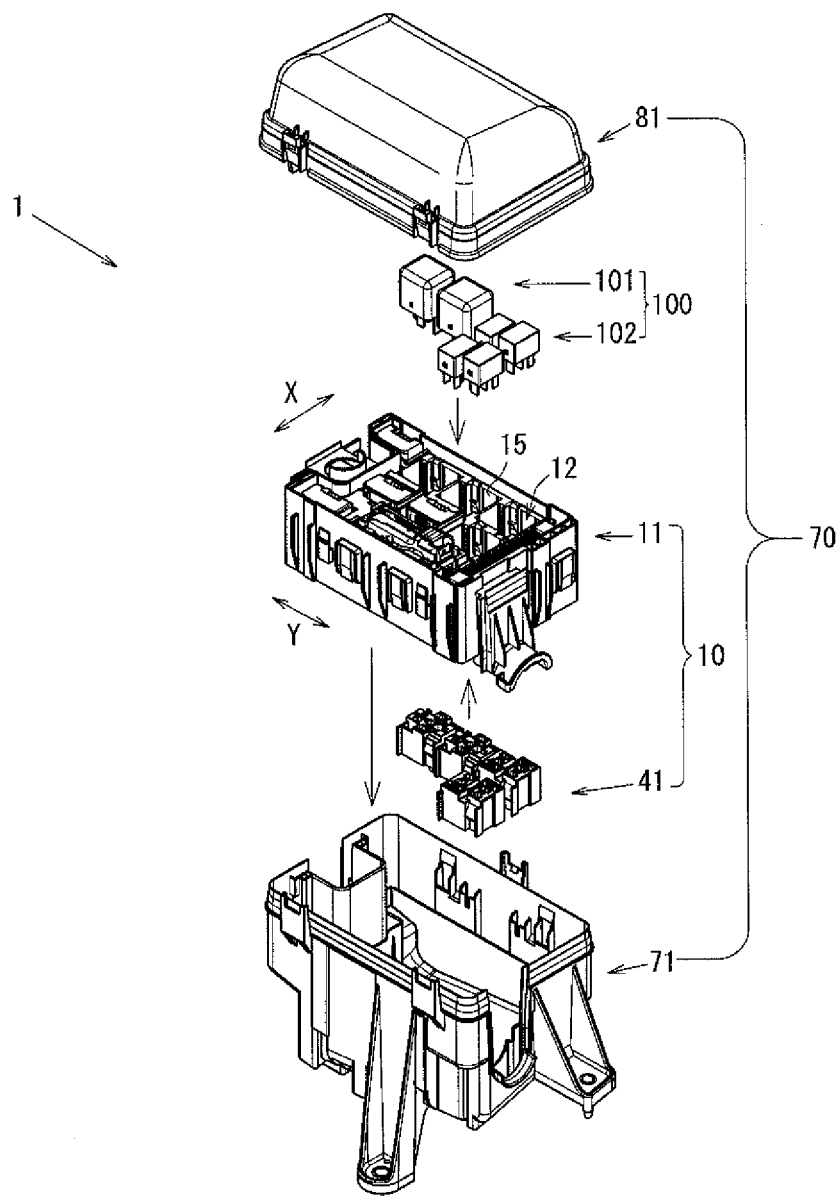
FIG. 1 is an exploded isometric view of an electric connection box.

Hereinafter, an embodiment of the present invention will be described with reference to the drawings.

An electric connection box 1 in this embodiment is a box which may be mounted on a vehicle and may supply power from a vehicle-mounted battery power source to a terminal device such as an audio device, an air conditioner or the like in a manner in which the supply of the power can be blocked. As shown in FIG. 1 through FIG. 6B, the electric connection box 1 includes an electric connection unit 10 and an electric connection box cover for accommodating the electric connection unit 10. The electric connection unit 10 and the electric connection box cover 70 are both formed of a synthetic resin material.

The electric connection box cover 70 has a generally parallelepiped box-like shape, and includes a tube-like lower cover 71 having a bottom and an upper cover 81 for covering an opening of the lower cover 71.

Figure 2:
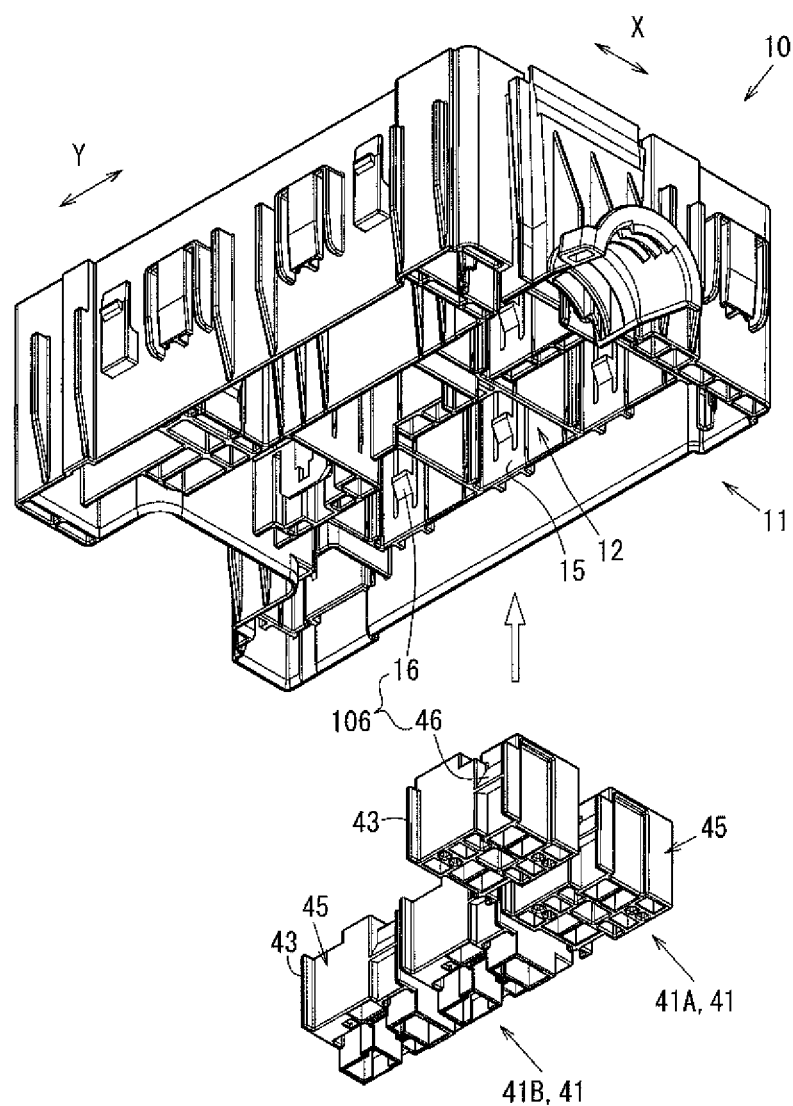
FIG. 2 is an exploded isometric view of components of the electric connection box.
Figure 5A:
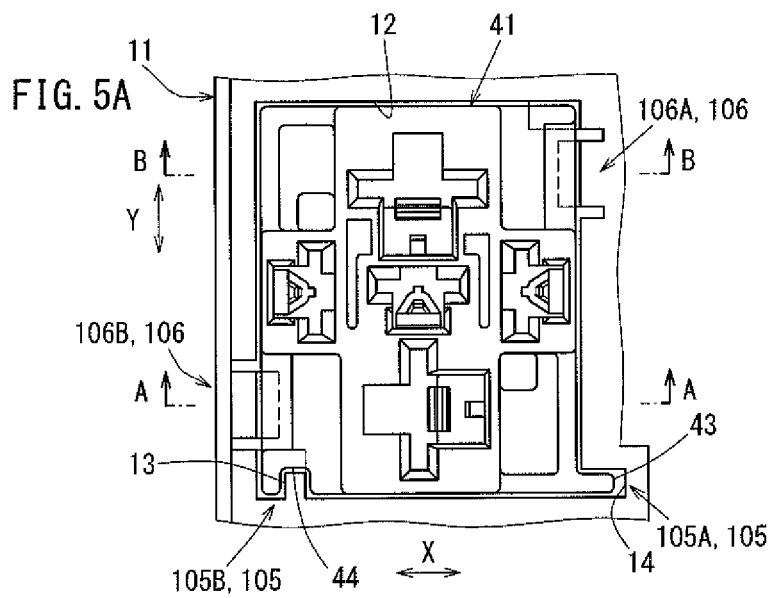
FIGS. 5A and 5B are each a plan view showing a state where the component mounting block is attached to an insertion permission section.
Figure 5B:
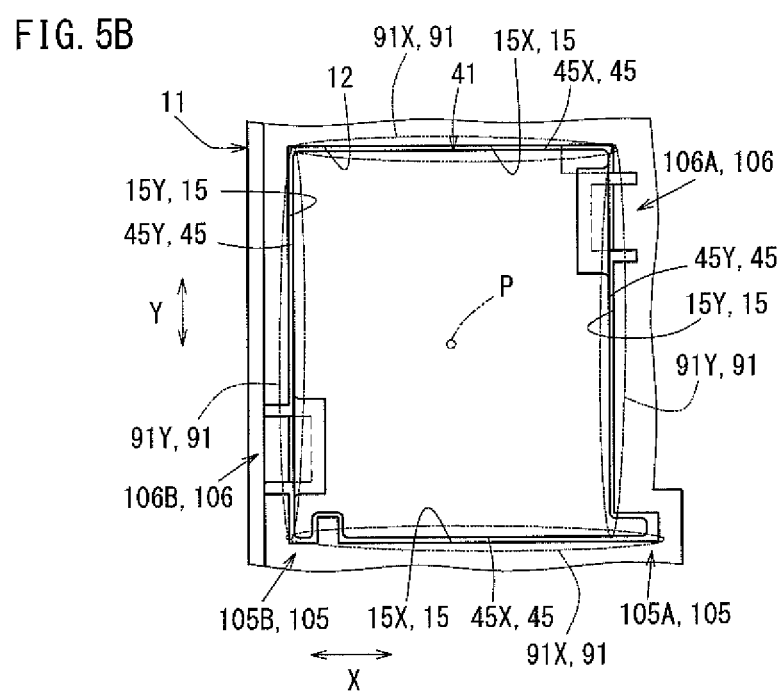

FIG. 1 is an exploded isometric view of the electric connection box 1 and electric components 100, which are to be mounted on the electric connection box 1. FIG. 2 is an isometric view of an insertion permission frame 11 and component mounting blocks 41 as seen obliquely from a bottom side thereof, and shows how the component mounting blocks 41 are inserted into the insertion permission frame 11. FIG. 3A is an isometric view of the component mounting block 41 as seen obliquely from a top side thereof, and FIG. 3B is an isometric view of the component mounting block 41 as seen obliquely from a bottom side thereof. FIG. 4A is an isometric view of the insertion permission frame 11, and FIG. 4B is an enlarged view of area X in FIG. 4A. FIGS. 5A and 5B are each a plan view showing a state where the component mounting block 41 is inserted into an insertion permission section 12. FIG. 5B omits a concaved and convexed shape provided in an inner area of the plan view, which is provided by a connection section for connecting the electric components 100 located in the component mounting block 41. FIG. 6A is a cross-sectional view of FIG. 5A taken along line A-A in FIG. 5A, and FIG. 6B is a cross-sectional view of FIG. 5A taken along line B-B in FIG. 5A.

In the following description, Y direction is a direction of a longer side of the electric connection box 1 as seen in a plan view, and X direction is a direction of a shorter side of the electric connection box 1 as seen in a plan view.

The electric connection unit 10 includes the component mounting block 41 connectable to the electric components 100 and the insertion permission frame 11 including insertion permission sections 12 for permitting the component mounting block 41 to be inserted thereto.

As shown in FIG. 4A, the insertion permission frame 11 includes the plurality of insertion permission sections 12 located in a lattice along the X direction and the Y direction. The insertion permission sections 12 each have an inner circumferential surface, which defines a quadrangular shape substantially the same as a cross-sectional shape of the component mounting block 41 perpendicular to an insertion direction in which the component mounting block 41 is inserted. A top and a bottom end of each of the insertion permission sections 12 in a thickness direction thereof are opened.

In other words, the insertion permission frame 11 includes a tube-like frame outer wall 17 having a generally rectangular shape as seen in a plan view and a lattice-like frame partition 19 for separating the inner space of the insertion permission frame 11 into a plurality of spaces. The insertion permission sections 12 are each formed of a part of the frame outer wall 17 and a part of the frame partition 19.

The component mounting block 41 is a block on which electric components 100 such as, for example, a relay 101, a fuse 102 and the like are mountable. As represented by reference signs 41A and 41B, a plurality of types of component mounting blocks 41 are available in accordance with the type or standard of the electric components 100 or the arranging pattern of the electric components 100.

As shown in FIG. 2, FIG. 3A, FIG. 3B, FIG. 5A and FIG. 5B, the component mounting blocks 41 each have a generally quadrangular prism shape having outer side surfaces 45 (outer walls) facing the inner side surfaces 15 (inner walls) of each insertion permission section 12.

As shown in FIG. 5B, the inner side surfaces 15 of the insertion permission section 12 include a pair of frame-side Y-direction inner side surfaces 15Y facing each other and extending in the Y direction as being parallel to each other, and a pair of frame-side X-direction inner side surfaces 15X facing each other and extending in the X direction as being parallel to each other.

As shown in FIG. 3A, FIG. 3B and FIG. 5B, the outer side surfaces 45 of the component mounting block 41 include a pair of block-side Y-direction outer side surfaces 45Y facing each other and extending in the Y direction as being parallel to each other and a pair of block-side X-direction outer side surfaces 45X facing each other and extending in the X direction as being parallel to each other.

In the state where the component mounting block 41 is inserted into the insertion permission section 12, the outer side surfaces 45 of the component mounting block 41 face the inner side surfaces 15 of the insertion permission section 12. In a plan view thereof, the outer side surfaces 45 of the component mounting block 41 and the inner side surfaces 15 of the insertion permission section 12 facing each other form side-surface facing parts 91 along substantially the entire circumference of the component mounting block 41.

This will be described in more detail. The side-surface facing parts 91 include a pair of Y-direction side-surface facing parts 91Y and a pair of X-direction side-surface facing parts 91X. In each Y-direction side-surface facing part 91, the block-side Y-direction outer side surface 45Y and the frame-side Y-direction inner side surface 15Y face each other. In each X-direction side-surface facing part 91X, the block-side X-direction outer side surface 45X and the frame-side X-direction inner side surface 15X face each other.

As shown in FIG. 5B, the Y-direction side-surface facing parts 91Y are located at one end side and the other end side in the X direction which have a plan-view center position P of the component mounting block 41 (gravitational center P) as the center therebetween. The Y-direction side-surface facing parts 91Y extend in the Y direction as being parallel to each other.

As shown in FIG. 5B, the X-direction side-surface facing parts 91X are located at one end side and the other end side in the Y direction which have the plan-view center position P of the component mounting block 41 as the center therebetween. The X-direction side-surface facing parts 91X extend in the X direction as being parallel to each other.

As shown in FIG. 6A and FIG. 6B, a frame-side engageable protrusion 16 and a block-side engageable protrusion 46 (see, especially the partially enlarged views of FIG. 6A and FIG. 6B) are provided as pull-out direction engagement means 106 (106A, 106B) for putting the component mounting block 41 into engagement with the insertion permission frame 11 in a direction opposite to the insertion direction Z1, namely, a pull-out direction Z2.

The frame-side engageable protrusion 16 protrudes toward the component mounting block 41 from a position which is generally the center in the insertion direction Z1 of the inner side surface 15 of the insertion permission section 12.

The block-side engageable protrusion 46 protrudes toward the inner side surface 15 of the insertion permission section 12 from the outer side surface 45 of the component mounting block 41 so as to be engageable with the frame-side engageable protrusion 16.

The frame-side engageable protrusion 16 and the block-side engageable protrusion 46 each have a protruding length in the X direction with which the protrusions 16 and 46 overlap each other, in other words, a protruding length in the X direction with which the protrusions 16 and 46 interfere with each other when the component mounting block 41 is inserted into the insertion permission section 12.

As shown in FIG. 5B, the pull-out direction engagement means 106 is provided at two positions of the side-surface facing parts 91 along the circumference of the component mounting block 41 as seen in a plan view. The two positions at which the pull-out direction engagement means 106 is provided are on a diagonal line while having the plan-view center position P of the component mounting block 41 at the center therebetween.

The pull-out direction engagement means 106 located at one of the positions is referred to as "first pull-out direction engagement means 106A", and the pull-out direction engagement means 106 located at the other position is referred to as the "second pull-out direction engagement means 106B".

This will be described in more detail. The first pull-out direction engagement means 106A is located at one of the pair of Y-direction side-surface facing parts 91Y which extend parallel to each other, and the second pull-out direction engagement means 106B is located at the other of the pair of Y-direction side-surface facing parts 91Y which extend parallel to each other. The first pull-out direction engagement means 106A and the second pull-out direction engagement means 106B are not located to directly face each other in the X direction but are located on a diagonal line while having the plan-view center position P of the component mounting block 41 at the center therebetween as described above (see FIG. 5B).

As shown in FIG. 4B, FIG. 6A and FIG. 6B, elastic support means 21 for elastically supporting the frame-side engageable protrusion 16 is provided at the inner side surface 15 of the insertion permission section 12. The elastic support means 21 includes an elastically deformable piece 22 which is elastically deformable (flexibly deformable) and a support section 23, of a structure having both ends thereof fixed, for supporting the elastically deformable piece 22.

The elastically deformable piece 22 is formed as a part of the inner side surface 15 of the insertion permission section 12, and has a lengthy structure with which as the component mounting block 41 is inserted into the insertion permission section 12, the elastically deformable piece 22 is elastically deformed in the X direction toward the side opposite to the block-side engageable protrusion 46, namely, toward the inside of the inner surface 15, until the block-side engageable protrusion 46 and the frame-side engageable protrusion 16 reach positions at which the protrusions 46 and 16 do not overlap each other in a gap between the outer side surface 45 of the component mounting block 41 and the inner side surface 15 of the insertion permission section 12.

As shown in FIG. 4B, the support section 23 are integrally coupled to the elastically deformable piece 22 on the inner side surface 15 of the insertion permission section 12 so as to be capable of supporting the elastically deformable piece 22 from both lateral sides thereof in the insertion/pull-out direction Z (up/down direction).

On the opposite side to the component mounting block 41 with respect to the elastically deformable piece 22 of the insertion permission frame 11, an elastic permission space 24 for permitting the elastically deformable piece 22 to be elastically deformed is provided.

The frame-side engageable protrusion 16 and the block-side engageable protrusion 46 respectively include engageable surfaces 16a and 46a on one side of the insertion/pull-out direction Z. The engageable surfaces 16a and 46a are on a plane which is perpendicular to the insertion/pull-out direction Z and are parallel to each other. The frame-side engageable protrusion 16 and the block-side engageable protrusion 46 also respectively include guiding surfaces 16b and 46b on the other side of the insertion/pull-out direction Z. The guiding surfaces 16b and 46b are inclined with respect to the insertion/pull-out direction Z and guide the elastically deformable piece 22 toward the elastic permission space 24.

As shown in FIG. 5A and FIG. 5B, block positioning means 105 for positioning the component mounting block 41 with respect to the insertion permission section 12 is provided at the insertion permission frame 11 and the component mounting block 41, on the perpendicular plane that is perpendicular to the insertion direction in which the component mounting block 41 is inserted into the insertion permission section 12.

The block positioning means 105 is provided at two positions at the side-surface facing parts 91 along the circumference of the component mounting block 41 so as to be capable of determining the position and the posture of the component mounting block 41 with respect to the insertion permission section 12 on the perpendicular plane, namely, so as to be capable of determining the position of the so as to be capable of determining the position of the component mounting block 41 in the X direction, the Y direction and a rotation direction of the component mounting block 41 about the center axis thereof.

The block positioning means 105 provided at one of the two positions is referred to as first block positioning means 105A, and the block positioning means 105 provided at the other position is referred to as second block positioning means 105B.

This will be described in more detail. As shown in FIG. 7A, the two positions of the block positioning means 105 are at close-side-surface facing parts 91N in the side-surface facing parts 91 along the circumference of the component mounting block 41. In the close-side-surface facing parts 91N, as the component mounting block 41 rotates with respect to the insertion permission section 12 in a rotation direction R1 in which the pull-out direction engagement means 106 provided on a diagonal line cancel the engagement, the component mounting block 41 approaches the insertion permission section 12.

FIGS. 7A and 7B each show a structure and functions of the block positioning means 105. FIG. 7A is a plan view and FIG. 7B is a vertical cross-sectional view which show an engagement state in the case where the component mounting block is positionally shifted with respect to the insertion permission section 12 in the R1 direction.

In FIG. 7A, arrow R1 indicates the rotation direction in which the pull-out direction engagement means 106 (106A, 106B) located on a diagonal line cancels the engagement. Namely, when the component mounting block 41 rotates in the R1 direction with respect to the insertion permission section 12, the block-side engageable protrusion 46 is distanced from the frame-side engageable protrusion 16, i.e., the block-side engageable protrusion 46 is disengaged from the frame-side engageable protrusion 16 as shown in FIG. 7B.

The close-side-surface facing parts 91N are parts of the side-surface facing parts 91 that are surrounded by the phantom lines in FIG. 7A on the plan-view circumstance of the component mounting block 41. Namely, in the close-side-surface facing parts 91N, as the component mounting block 41 rotates in the R1 direction with respect to the insertion permission section 12, the outer side surface 45 of the component mounting block 41 approaches the inner side surface 15 of the insertion permission section 12.

Referring to FIG. 7A, in parts of the side-surface facing parts 91 on the plan-view circumference of the component mounting block 41 that are not surrounded by the phantom lines, as the component mounting block 41 rotates in the R1 direction with respect to the insertion permission section 12, the outer side surface 45 of the component mounting block 41 is distanced away from the inner side surface 15 of the insertion permission section 12.

This will be described in more detail. As shown in FIG. 5A and FIG. 5B, the first block positioning means 105A is located at one of the pair of Y-direction side-surface facing parts 91Y at which the first pull-out direction engagement means 106A is located, at one of two ends, in the Y direction, of the Y-direction side-surface facing part 91Y that is opposite to the end at which the first pull-out direction engagement means 106A is located.

As shown in FIG. 5A and FIG. 5B, the second block positioning means 105B is located at one of the pair of X-direction side-surface facing parts 91X at which the second pull-out direction engagement means 106B is located, at one of two ends, in the X direction, of the X-direction side-surface facing part 91X that is on the same side as the end at which the second pull-out direction engagement means 106B is located.

The block positioning means 105 includes positioning protrusions 13 and 43 protruding from one of the component mounting block 41 and the insertion permission frame 11 toward the other of the component mounting block 41 and the insertion permission frame 11, and positioning recesses 44 and 14 located at the other of the component mounting block 41 and the insertion permission frame 11 so as to be engageable with the positioning protrusions 13 and 43.

This will be described in more detail. The first block positioning means 105A includes the positioning protrusion 43 protruding from the component mounting block 41 toward the insertion permission frame 11 and the positioning recess 14 located at the insertion permission frame 11 so as to be engageable with the positioning protrusion 43.

The second block positioning means 105B includes the positioning protrusion 13 protruding from the insertion permission frame 11 toward the component mounting block 41 and the positioning recess 44 located at the component mounting block 41 so as to be engageable with the positioning protrusion 13.

Functions and effects provided by the electric connection box 1 having the above-described structure will be described with reference to FIG. 7A through FIG. 10.

Figure 8A:
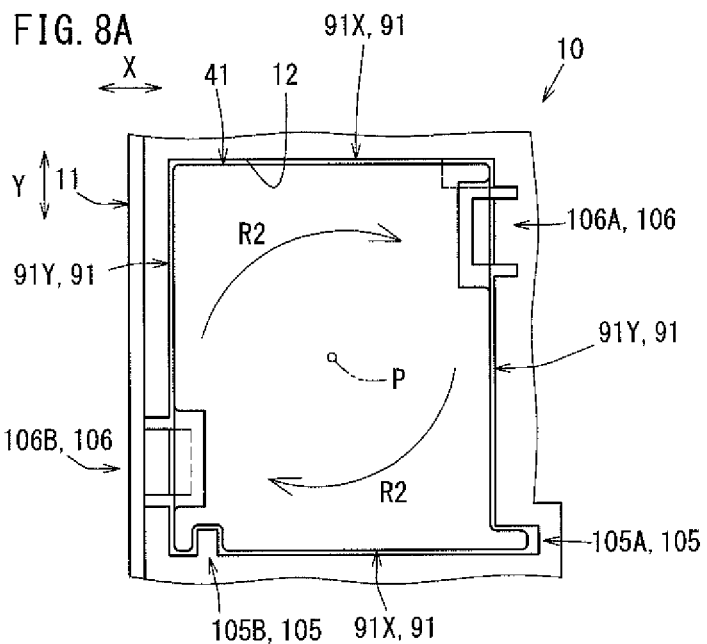
FIGS. 8A and 8B each show functions of the block positioning means and the pull-out direction engagement means.
Figure 8B:
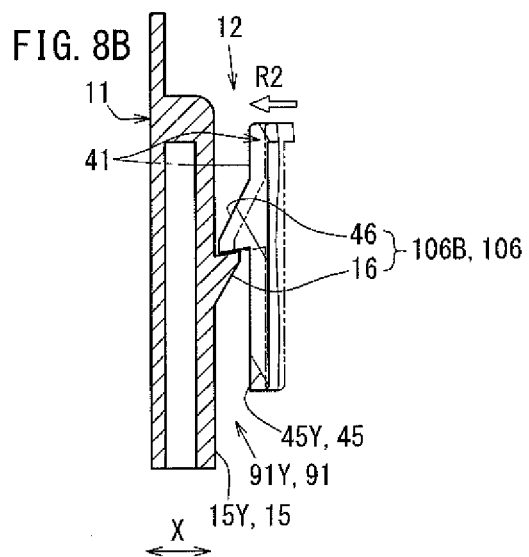
Figure 10:
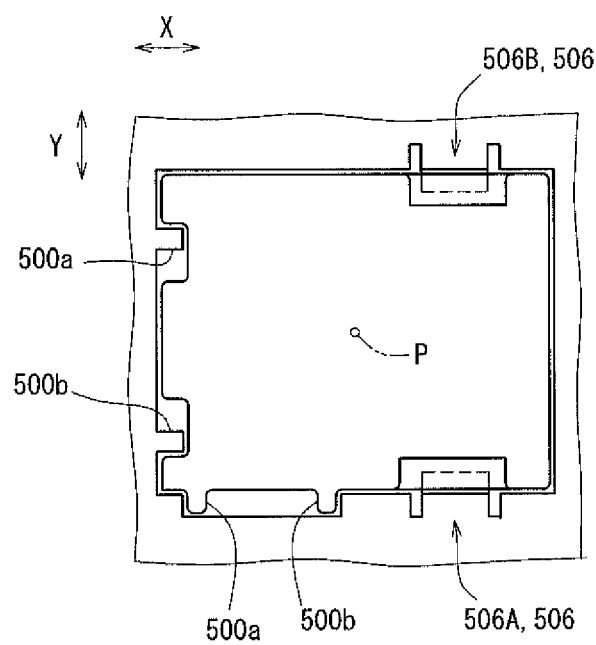
FIG. 10 shows functions of conventional block positioning means and conventional pull-out direction engagement means.

FIGS. 8A and 8B each show functions of the block positioning means 105. In more detail, FIG. 8A is a plan view and FIG. 8B is a vertical cross-sectional view which show an engagement state in the case where the component mounting block is positionally shifted with respect to the insertion permission section 12 in an R2 direction opposite to the R1 direction. FIGS. 9A1 through 9B2 each show functions of the elastic support means 21. FIG. 9A1 through FIG. 9A3 are each a vertical cross-sectional view showing an engagement realized by the pull-out direction engagement means 106 when the component mounting block 41 is inserted into the insertion permission section 12. FIG. 9B1 and FIG. 9B2 are each a vertical cross-sectional view showing how an elastic restriction protrusion 72 is inserted into the elastic permission space 24 as the insertion permission frame 11 is accommodated in the lower cover 71. FIG. 10 shows conventional block positioning means and conventional pull-out direction engagement means.

As described above, the block positioning means 105 includes the positioning protrusions 13 and 43 protruding from one of the component mounting block 41 and the insertion permission frame 11 toward the other of the component mounting block 41 and the insertion permission frame 11, and the positioning recesses 44 and 14 located at the other of the component mounting block 41 and the insertion permission frame 11 so as to be engageable with the positioning protrusions 13 and 43. Therefore, the block positioning means 105 can position the component mounting block 41 by putting the positioning protrusions 13 and 43 protruding from one of the component mounting block 41 and the insertion permission frame 11 toward the other of the component mounting block 41 and the insertion permission frame 11 into engagement with the positioning recesses 44 and 14.

Owing to such a positioning structure, clearances of the positions at which the positioning protrusions 13 and 43 and the positioning recesses 44 and 14 are formed can be suppressed in directions that are perpendicular to the directions in which the positioning protrusions 13 and 43 protrude.

Therefore, the component mounting block 41 can be firmly inserted into the insertion permission frame 11 without becoming unstable.

This will be described in more detail. In general, ribs for positioning are not formed at exactly desired positions but are inevitably formed at positions shifted from the desired positions due to a molding error or the like. Such an error regarding the formation of the ribs exerts an adverse influence on the positioning precision of the component mounting block 41 with respect to the insertion permission frame 11.

For example, in FIG. 10, two or more positioning ribs 500a protruding in a direction perpendicular to a prescribed direction (Y direction) are located at positions which are away from each other by a prescribed distance. Two or more positioning ribs 500b protruding in a direction perpendicular to a prescribed direction (X direction) are located at positions which are away from each other by a prescribed distance. In such a conventional structure where two or more ribs 500a and two or more ribs 500b are formed at separate positions, the errors of the two ribs 500a are accumulated in a prescribed direction and the errors of the two ribs 500b are also accumulated in a prescribed direction. This causes a problem that the adverse influence of the errors regarding the formation of the ribs is exerted more easily.

By contrast, in this embodiment, the positioning protrusions 13 and 43 protruding from one of the component mounting block 41 and the insertion permission frame 11 toward the other of the component mounting block 41 and the insertion permission frame 11 are put into engagement with the positioning recesses 44 and 14. Owing to this, the component mounting block 41 can be positioned with respect to the insertion permission frame 11 by one positioning protrusion 13 or 43 and one positioning recess 44 or 14 corresponding thereto provided in one direction (see FIG. 5A).

In the conventional structure, for example, two or more positioning ribs 500a and two or more positioning ribs 500b protruding in the directions perpendicular to the prescribed directions are located at positions which are away from each other by prescribed distances. In such a structure, the errors of the positions at which the ribs 500a are actually formed with respect to the positions at which the ribs 500a are to be formed are accumulated. The errors of the positions at which the ribs 500b are actually formed with respect to the positions at which the ribs 500b are to be formed are accumulated. By contrast, in this embodiment, such an accumulation of the errors does not occur. The component mounting block 41 can be firmly positioned with respect to the insertion permission frame 11 in the directions perpendicular to the directions in which the positioning protrusions 13 and 43 protrude.

Therefore, even if the vehicle is used for a long time in an environment in which the vehicle is vibrated, a superb electric connection state can be kept between the component mounting block 41 and the insertion permission frame 11.

In addition, the positioning in a prescribed direction can be realized by use of one positioning protrusion 13 or 43 and one positioning recess 44 or 14 corresponding thereto. The conventional positioning means for realizing the positioning uses two or more ribs 500a located at separate positions in one direction and two or more ribs 500b located at separate positions in another direction. In this embodiment, as compared with the conventional means, the influence of the errors regarding the formation of the ribs can be suppressed. Therefore, the tolerance between the component mounting block 41 and the insertion permission frame 11 is not made too small.

Thus, the component mounting block 41 can be inserted smoothly into and the insertion permission frame 11.

As described above, the positioning protrusions 13 and 43 protruding from one of the component mounting block 41 and the insertion permission frame 11 toward the other of the component mounting block 41 and the insertion permission frame 11 are put into engagement with the positioning recesses 44 and 14. Owing to this, the positioning can be realized efficiently with no need to form two or more ribs. This can simplify the structure.

In the electric connection box 1, the pull-out direction engagement means 106 is located at the pair of Y-direction side-surface facing parts 91Y, more specifically, at two positions on a diagonal line.

In the conventional structure shown in FIG. 10, pull-out direction engagement means 506 (506A, 506B) is located at the same number of positions as that of the pull-out direction engagement means 106, but the pull-out direction engagement means 506A and the pull-out direction engagement means 506B are located to directly face each other. In this embodiment, as compared with the conventional structure, the component mounting block 41 can be engaged with the insertion permission frame 11 at a better balance and thus more stably.

Thus, the component mounting block 41 can be engaged with the insertion permission frame 11 stably.

This will be described in more detail. For example, the pull-out direction engagement means 106A located at one of the pair of Y-direction side-surface facing parts 91Y and the pull-out direction engagement means 106B located at the other of the pair of Y-direction side-surface facing parts 91Y can be located so as to have the plan-view center position P of the component mounting block 41 (plan-view gravitational center) therebetween. Therefore, the gravitational center of the component mounting block 41 can be firmly supported by the pull-out direction engagement means 106. Thus, the component mounting block 41 can be engaged with the insertion permission frame 11 at a good balance and stably.

In the electric connection box 1, the block positioning means 105 is located in the close-side-surface facing parts 91N. In the close-side-surface facing parts 91N on the circumference of the component mounting block 41, as the component mounting block 41 rotates with respect to the insertion permission section 12 in the rotation direction R1 (FIG. 7B) in which the pull-out direction engagement means 106 located at the positions on a diagonal line cancels the engagement, the component mounting block 41 approaches the insertion permission section 12 as shown in FIG. 7A.

Therefore, in whichever rotation direction (clockwise direction or counterclockwise direction) the component mounting block 41 may rotate about the insertion direction with respect to the insertion permission section 12, the pull-out direction engagement means 106 located at the positions on a diagonal line can keep the firm engagement state.

This will be described in more detail. As described above, the block positioning means 105 is located in the close-side-surface facing parts 91N, in which the component mounting block 41 approaches the insertion permission section 12. Owing to this, even when the component mounting block 41 is positionally shifted with respect to the insertion permission section 12 as a result of rotating in the R1 direction in which the frame-side engageable protrusion 16 and the block-side engageable protrusion 46 are disengaged from each other (FIG. 7B) in each of the first pull-out direction engagement means 106A and the second pull-out direction engagement means 106B located at the positions on a diagonal line, the positioning protrusions 13 and 43 can be firmly and deeply engaged with the positioning recesses 44 and 14 in each of the first block positioning means 105A and the second block positioning means 105B as shown in the partial enlarged views of FIG. 7A. The R1 direction is one of the rotation directions in which the component mounting block 41 rotates with respect to the insertion permission section 12 about the insertion direction.

Owing to this, even when the component mounting block 41 is positionally shifted unexpectedly with respect to the insertion permission section 12 in the R1 direction, namely, in the rotation direction in which the above-described engagement is cancelled in each of the first pull-out direction engagement means 106A and the second pull-out direction engagement means 106B located at the positions on a diagonal line, the engagement can be firmly kept in each of the first pull-out direction engagement means 106A and the second pull-out direction engagement means 106B by the first block positioning means 105A and the second block positioning means 105B.

Referring to FIG. 8A, when the component mounting block 41 is positionally shifted with respect to the insertion permission section 12 as a result of rotating in the R2 direction opposite to the R1 direction, the positioning protrusions 13 and 43 are to be pulled out from the positioning recesses 44 and 14. The R2 direction is one of the rotation directions in which the component mounting block 41 rotates with respect to the insertion permission section 12 about the insertion direction.

However, as shown in FIG. 8B, when the component mounting block 41 is positionally shifted with respect to the insertion permission section 12 in the R2 direction, the frame-side engageable protrusion 16 and the block-side engageable protrusion 46 are engaged more with each other in each of the first pull-out direction engagement means 106A and the second pull-out direction engagement means 106B. Therefore, the frame-side engageable protrusion 16 and the block-side engageable protrusion 46 can be prevented from being disengaged from each other unexpectedly.

Therefore, in whichever rotation direction (R1 direction or R2 direction) the component mounting block 41 may rotate with respect to the insertion permission section 12 about the insertion direction, the firm engagement state can be kept in each of the first pull-out direction engagement means 106A and the second pull-out direction engagement means 106B.

In the electric connection box 1, as shown in FIG. 4B, FIG. 6A and FIG. 6B, the elastic support means 21 for elastically supporting the frame-side engageable protrusion 16 is provided at the insertion permission frame 11. The elastic support means 21 includes the elastically deformable piece 22 which is elastically deformed toward the side opposite to the block-side engageable protrusion 46 until, as the component mounting block 41 is inserted into the insertion permission section 12, the block-side engageable protrusion 46 and the frame-side engageable protrusion 16 reach positions at which the protrusions 46 and 16 do not overlap each other in the gap between the outer side surface 45 of the component mounting block 41 and the inner side surface 15 of the insertion permission section 12. The elastic support means 21 also, includes the support section 23 for supporting the elastically deformable piece 22 from both lateral sides thereof with respect to the frame-side engageable protrusion 16.

As described above, the elastically deformable piece 22 is elastically deformable toward the side opposite to the block-side engageable protrusion 46 until the frame-side engageable protrusion 16 and the block-side engageable protrusion 46 reach positions at which the protrusions 16 and 46 do not overlap each other. Therefore, as shown in FIG. 9A1 and FIG. 9A2, when the component mounting block 41 is inserted into the insertion permission section 12, the frame-side engageable protrusion 16 and the block-side engageable protrusion 46 protruding toward each other do not interfere with each other. Thus, the component mounting block 41 can be smoothly inserted into the insertion permission section 12 without being inhibited.

While the component mounting block 41 is inserted into the insertion permission section 12, immediately after the block-side engageable protrusion 46 passes by the frame-side engageable protrusion 16, the block-side engageable protrusion 46 and the frame-side engageable protrusion 16 can be firmly engaged with each other as shown in FIG. 9A2 and FIG. 9A3 by the elastic force (recovery force) of the elastically deformable piece 22 which has been elastically deformed.

As shown in FIGS. 9A1, 9A2 and 9A3, a stopper 18 is provided at a top end of the inner side surface 15 of the insertion permission section 12 (i.e., an end on the deep side in the insertion direction in which the component mounting block 41 is inserted into the insertion permission section 12) in a state of protruding toward the component mounting block 41 so as to be engageable with the component mounting block 41. Owing to the stopper 18, the component mounting block 41 inserted into the insertion permission section 12 can be prevented from being pulled out upward from the insertion permission section 12.

In addition, the elastically deformable piece 22 is elastically deformable toward the side opposite to the block-side engageable protrusion 46 until the block-side engageable protrusion 46 and the frame-side engageable protrusion 16 reach positions at which the protrusions 46 and 16 do not overlap each other. Therefore, the inner side surface 15 of the insertion permission section 12 and the outer side surface 45 of the component mounting block 41 can be located to have a gap therebetween which is narrow enough for the block-side engageable protrusion 46 and the frame-side engageable protrusion 16 to overlap each other. This allows the component mounting block 41 and the insertion permission frame 11 to be assembled together in a compact structure.

The elastic support means 21 is of a structure having both ends thereof fixed and supports the elastically deformable piece 22 from both lateral sides thereof with respect to the frame-side engageable protrusion 16 by use of the support section 23 (see FIG. 4B). Therefore, the elastic support means 21 has a superior elasticity to elastic support means having a cantilever structure.

In addition, unlike in the case of the cantilever structure with which one end of the elastically deformable piece 22 would be a free end, it is not necessary to divide the inner side surface 15 of the insertion permission section 12 in the circumferential direction. This allows the insertion permission section 12 to have a high strength.

This will be described in more detail. As described above, the elastic support means 21 is of a structure having both ends thereof fixed and supports the elastically deformable piece 22 from both lateral sides thereof with respect to the frame-side engageable protrusion 16 by use of the support section 23. Owing to this structure, the integrity of the inner side surface 15 of the insertion permission section 12 in the circumferential direction, namely, the rigidity of each of the frame outer wall 17 and the frame partition 19 included in the insertion permission frame 11, can be significantly improved as compared with the case of the cantilever structure.

Owing to this, even if, for example, the component mounting block 41 is about to be positionally shifted with respect to the insertion permission section 12, the component mounting block 41 that is about to be positionally shifted can be firmly received by the inner side surface 15 of the insertion permission section 12 in a state where the positioning protrusions 13 and 43 are engaged with the positioning recesses 44 and 14.

Thus, owing to the above-described structure of the elastic support means 21 of having both ends thereof fixed and supporting the elastically deformable piece 22 from both lateral sides thereof by use of the support section 23, the insertion permission section 12 and the component mounting block 41 inserted into the insertion permission section 12 can have a high integrity which prevents the component mounting block 41 from being positionally shifted with respect to the insertion permission section 12.

In the electric connection box 1, the elastic permission space 24 which permits the elastic support means 21 to be elastically deformed is provided on the opposite side to the component mounting block 41 with respect to the elastic support means 21, and the lower cover 71 is provided with the elastic restriction protrusion 72 insertable into the elastic permission space 24 so as to restrict the elastic deformation of the elastic support means 21.

According to the above-described structure, as shown in FIG. 9B1 and FIG. 9B2, when the insertion permission frame 11 is put into engagement with the lower cover 71 for accommodating the electric component connection unit 10 (insertion permission frame 11) in the lower cover 71, the elastic restriction protrusion 72 provided on the lower cover 71 is inserted into the elastic permission space 24. Owing to this, the elastic restriction protrusion 72 inserted into the elastic permission space 24 can restrict the elastic support means 21 from being elastically deformed toward the elastic permission space 24.

Therefore, in a state where the insertion permission frame 11 is accommodated in the lower cover 71, the elastically deformable piece 22 is not elastically deformed toward the elastic permission space 24, for example. Thus, the frame-side engageable protrusion 16 provided on the elastically deformable piece 22 is not moved so as to be distanced away from the block-side engageable protrusion 46. This prevents the frame-side engageable protrusion 16 and the block-side engageable protrusion 46 from being disengaged from each other unexpectedly. Thus, the superb engagement state between the frame-side engageable protrusion 16 and the block-side engageable protrusion 46 can be kept (see FIG. 9B2).

The unit accommodation container according to the present invention corresponds to the lower cover 71 in this embodiment; and similarly, the parallel side-surface facing parts correspond to Y-direction side-surface facing parts 91Y; and the elastic restriction means corresponds to the elastic restriction protrusion 72. However, the present invention is not limited to the above-described embodiment, and may be carried out in various other embodiments.

In the electric connection unit 10 in the above-described embodiment, the pair of Y-direction side-surface facing parts 91Y located parallel to each other are provided as the parallel side-surface facing parts, and the pull-out direction engagement means 106A and the pull-out direction engagement means 106B are respectively located at the pair of Y-direction side-surface facing parts 91Y. The pair of X-direction side-surface facing parts 91X also extend in the X direction as being parallel to each other. Therefore, the pair of X-direction side-surface facing parts 91X may be provided as the parallel side-surface facing parts, and the pull-out direction engagement means 106A and the pull-out direction engagement means 106B may be respectively located at the pair of X-direction side-surface facing parts 91X.

REFERENCE SIGNS LIST

1 . . . Electric connection box
10 . . . Electric connection unit
11 . . . Insertion permission frame
12 . . . Insertion permission section
13, 43 . . . Positioning protrusion
14, 44 . . . Positioning recess
15 . . . Inner side surface of the insertion permission frame
16 . . . Frame-side engageable protrusion
21 . . . Elastic support means
22 . . . Elastic deformable piece
23 . . . Support section
24 . . . Elastic permission space
41 . . . Component mounting block
45 . . . Outer side surface of the component mounting block
46 . . . Block-side engageable protrusion
71 . . . Lower cover
72 . . . Elastic restriction protrusion
91 . . . Side-surface facing part
91N . . . Close-side-surface facing part
91X . . . X-direction side-surface facing part
91Y . . . Y-direction side-surface facing part
100 . . . Electric component
105 . . . Block positioning means
106 . . . Pull-out direction engagement means
106A . . . First pull-out direction engagement means
106B . . . Second pull-out direction engagement means

The invention claimed is:

1. An electric component connection unit, comprising:
a component mounting block to which an electric component is attachable; and
an insertion permission frame having provided therein an insertion permission section for allowing the component mounting block to be inserted thereinto;
wherein:
side-surface facing parts are provided in each of which an outer side surface of the component mounting block and an inner side surface of the insertion permission frame face each other in a crossing direction crossing an insertion direction in which the component mounting block is inserted into the insertion permission section,
a first pair of side-surface facing parts which are generally parallel to each other in the crossing direction are provided in the side-surface facing parts,
a second pair of side-surface facing parts which are generally parallel to each other and perpendicular to the first pair of side-surface facing parts in the crossing direction are provided in the side-surface facing parts,
pull-out direction engagement means, for putting the component mounting block into engagement with the insertion permission section in a pull-out direction which is opposite to the insertion direction and in which the component mounting block inserted into the insertion permission section is pulled out from the insertion permission section, is provided at the first pair of side-surface facing parts,
the pull-out direction engagement means includes first pull-out direction engagement means and second pull-out direction engagement means, located at positions on a diagonal line, the positions being respectively at the first pair of side-surface facing parts,
the first pull-out direction engagement means is located at one of the first pair of side-surface facing parts,
the second pull-out direction engagement means is located at the other of the first pair of side-surface facing parts,
block positioning means is provided at the insertion permission frame and the component mounting block, the block positioning means being for positioning the component mounting block with respect to the insertion permission section in the crossing direction,
the block positioning means includes first block positioning means and second block positioning means,
the first block positioning means is located at one of the first pair of side-surface facing parts, at one of two ends that is opposite to the end at which the first pull-out direction engagement means is located, and includes:
a block-side engageable protrusion protruding from the component mounting block toward the insertion permission frame; and
a frame-side positioning recess located a the insertion permission frame so as to be engageable with the block-side engageable protrusion, and
the second block positioning means is located at one of the second pair of side-surface facing parts, at one of two ends that is on the same side as the end at which the second pull-out direction engagement means is located, and includes:
a frame-side engageable protrusion protruding from the insertion permission frame toward the component mounting; and
a block-side positioning recess located at the component mounting block so as to be engageable with the frame-side engageable protrusion.

2. An electric component connection unit according to claim 1, wherein the block positioning means is formed at the side-surface facing parts in which as the component mounting block rotates with respect to the insertion permission section in a rotation direction in which the engagement of the pull-out direction engagement means is located at the positions on the diagonal line is cancelled, the component mounting block approaches the insertion permission section, the pull-out direction engagement means being on a circumference of the component mounting block.

3. An electric component connection unit according to claim 1, wherein:
the pull-out direction engagement means includes the frame-side engageable protrusion protruding from the inner side surface of the insertion permission section toward the component mounting block and the block-side engageable protrusion protruding from the outer side surface of the component mounting block toward the insertion permission section so as to be engageable with the frame-side engageable protrusion;
elastic support means for elastically supporting the frame-side engageable protrusion is provided at the insertion permission frame; and
the elastic support means includes:
an elastically deformable piece deformable toward the side opposite to the block-side engageable protrusion until, as the component mounting block is inserted into the insertion permission section, the block-side engageable protrusion and the frame-side engageable protrusion reach positions at which the protrusions do not overlap each other in a gap between the outer side surface of the component mounting block and the inner side surface of the insertion permission section; and a support section for supporting the elastically deformable piece from both lateral sides thereof with respect to the frame-side engageable protrusion.

4. An electric connection box, comprising:

the electric component connection unit according to claim 3; and a unit accommodation container for accommodating the electric component connection unit;

wherein:

an elastic permission space for allowing the elastic support means to be elastically deformed is provided at the side opposite to the component mounting block with respect to the elastic support means; and the unit accommodation container includes elastic restriction means insertable into the elastic permission space so as to restrict the elastic support means from being elastically deformed.

5. An electric component mounting block which is insertable into an insertion permission section provided in an insertion permission frame and on which an electric component is attachable; comprising:

a block-side positioning recess engageable with a frame-side engageable protrusion protruding from the insertion permission frame so as to be capable of positioning the electric component mounting block with respect to the insertion permission frame in a crossing direction crossing an insertion direction in which the electric component mounting block is inserted into the insertion permission section; and a block-side engageable protrusion protruding so as to be engageable with a frame-side positioning recess provided in the insertion permission frame, wherein:

side-surface facing parts are provided in each of which an outer side surface of the component mounting block and an inner side surface of the insertion permission frame face each other in the crossing direction, a first pair of side-surface facing parts which are generally parallel to each other in the crossing direction are provided in the side-surface facing parts, a second pair of side-surface facing parts which are generally parallel to each other and perpendicular to the first s air of side-surface facing parts in the crossing direction are provided in the side-surface facing parts, pull-out direction engagement means, for putting the component mounting block into engagement with the insertion permission section in a pull-out direction which is opposite to the insertion direction and in which the component mounting block inserted into the insertion permission section is pulled out from the insertion permission section, is provided at the first pair of side-surface facing parts, the pull-out direction engagement means includes first pull-out direction engagement means and second pull-out direction engagement means, located at positions on a diagonal line, the positions being respectively at the first pair of side-surface facing parts, the first pull-out direction engagement means is located at one of the first pair of side-surface facing parts, the second pull-out direction engagement means is located at the other of the first pair of side-surface facing parts, block positioning means is provided at the insertion permission frame and the component mounting block, the block positioning means being for positioning the component mounting block with respect to the insertion permission section in the crossing direction, the block positioning means includes first block positioning means and second block positioning means, the first block positioning means is located at one of the first pair of side-surface facing parts, at one of two ends that is opposite to the end at which the first pull-out direction engagement means is located, and includes:

the block-side engageable protrusion protruding from the component mounting block toward the insertion permission frame and the frame-side positioning recess located at the insertion permission frame so as to be engageable with the block-side engageable protrusion, and the second block positioning means is located at one of the second pair of side-surface facing parts, at one of two ends that is on the same side as the end at which the second pull-out direction engagement means is located, and includes:

the frame-side engageable protrusion protruding from the insertion permission frame toward the component mounting; and the block-side positioning recess located at the component mounting block so as to be engageable with the frame-side engageable protrusion.

6. An insertion permission frame, wherein:

an insertion permission section for allowing insertion thereinto of a component mounting block on which an electric component is attachable is provided;

a frame-side engageable protrusion engageable, in a direction in which the component mounting block is pulled out from the insertion permission section, with a block-side engageable protrusion protruding from an outer side surface of the component mounting block toward an inner side surface of the insertion permission section is provided on the inner side surface of the insertion permission section; and elastic support means for elastically supporting the frame-side engageable protrusion includes:

an elastically deformable piece deformable toward the side opposite to the block-side engageable protrusion, as the component mounting block is inserted into the insertion permission section, the block-side engageable protrusion and the frame-side engageable protrusion reach positions at which the protrusions do not overlap each other in a gap between the outer side surface of the component mounting block and the inner side surface of the insertion permission section; and a support section for supporting the elastically deformable piece from both lateral sides thereof with respect to the frame-side engageable protrusion, side-surface facing parts are provided in each of which an outer side surface of the component mounting block and an inner side surface of the insertion permission frame face each other in a crossing direction crossing an insertion direction in which the component mounting block is inserted into the insertion permission section, a first pair of side-surface facing parts which are generally parallel to each other in the crossing direction are provided in the side-surface facing parts, a second pair of side-surface facing parts which are generally parallel to each other and perpendicular to the first pair of side-surface facing parts in the crossing direction are provided in the side-surface facing parts, pull-out direction engagement means, for putting the component mounting block into engagement with the insertion permission section in a pull-out direction which is opposite to the insertion direction and in which the component mounting block inserted into the insertion permission section is pulled out from the insertion permission section, is provided at positions on a diagonal line, the positions being respectively at the first pair of side-surface facing parts, the pull-out direction engagement means includes first pull-out direction engagement means and second pull-out direction engagement means, located at positions on the diagonal line, the first pull-out direction engagement means is located at one of the first pair of side-surface facing parts, the second pull-out direction engagement means is located at the other of the first pair of side-surface facing parts, block positioning means is provided at the insertion permission frame and the component mounting block, the block positioning means being for positioning the component mounting block with respect to the insertion permission section in the crossing direction, the block positioning means includes first block positioning means and second block positioning means, the first block positioning means is located at one of the first pair of side-surface facing parts, at one of two ends that is opposite to the end at which the first pull-out direction engagement means is located, and includes:

the block-side engageable protrusion and a frame-side positioning recess located at the insertion emission frame so as to be engageable with the block-side engageable protrusion, and the second block positioning means is located at one of the second pair of side-surface facing parts, at one of two ends that is on the same side as the end at which the second pull-out direction engagement means is located, and includes:

the frame-side engageable protrusion; and a block-side positioning recess located at the component mounting block so as to be engageable with the frame-side engageable protrusion.

* * * * *